United States Patent
Suhara

(10) Patent No.: US 6,864,431 B2
(45) Date of Patent: Mar. 8, 2005

(54) FRAGILE-BOARD SUPPORTING METHOD, CIRCUIT-BOARD SUPPORTING DEVICE, AND ELECTRIC-CIRCUIT MANUFACTURING METHOD

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 281 days.

(21) Appl. No.: 10/104,037

(22) Filed: Mar. 25, 2002

(65) Prior Publication Data

US 2002/0141166 A1 Oct. 3, 2002

(30) Foreign Application Priority Data

Mar. 29, 2001 (JP) ........................................ 2001-095550

(51) Int. Cl.[7] .................................................. H05K 7/04
(52) U.S. Cl. .................. 174/138 D; 361/742; 361/770; 361/807; 29/760; 29/762
(58) Field of Search ................................ 361/807, 742, 361/758, 770; 29/760, 762, 743; 269/21, 289 R, 903; 174/138 D, 138 E

(56) References Cited

U.S. PATENT DOCUMENTS

| | | | | |
|---|---|---|---|---|
| 5,932,065 A | * | 8/1999 | Mitchell | 156/556 |
| 6,008,476 A | * | 12/1999 | Neiconi et al. | 219/388 |
| 6,161,749 A | * | 12/2000 | Bastacky et al. | 228/49.5 |
| 6,189,876 B1 | * | 2/2001 | Frazier | 269/21 |
| 6,635,308 B1 | * | 10/2003 | Forrest et al. | 427/96 |

FOREIGN PATENT DOCUMENTS

JP          A 6-104593          4/1994

* cited by examiner

Primary Examiner—Kamand Cuneo
Assistant Examiner—Hung S. Bui
(74) Attorney, Agent, or Firm—Oliff & Berridge, PLC

(57) ABSTRACT

A method of supporting a fragile board by a plurality of supporting members formed of respective elastic materials. The method includes steps of: (a) preparing a plurality of first and second supporting members as the supporting members such that the second supporting members have higher compression modulus than the first supporting members; (b) arranging the first and second supporting members on a plane such that each of the first supporting members is adjacent to a corresponding one of the second supporting members and such that each of the first supporting members has a larger height from the plane than each of the second supporting members; and (c) positioning the first and second supporting members under the board, whereby the board is supported at a lower surface thereof by the supporting members.

18 Claims, 6 Drawing Sheets

FRAGILE-BOARD SUPPORTING METHOD,
CIRCUIT-BOARD SUPPORTING DEVICE,
AND ELECTRIC-CIRCUIT
MANUFACTURING METHOD

BACKGROUND OF THE INVENTION

1. Field of the Invention

The present invention relates to a method of supporting a board which is made of a ceramic or other fragile material, for mounting an electric component onto the fragile board, for applying an adhesive into a desired spot of the fragile board, or for other purpose. The invention also relates to a device suitable for carrying out such a supporting method.

2. Discussion of Related Art

There is known an operation for manufacturing an electric or electronic circuit, by mounting electric or electronic components onto a circuit board such as a printed circuit board. Such a manufacturing operation is commonly carried out by using a board work system including (a) a board holding device for holding the circuit board, (b) a working head for achieving a predetermined operation in a desired portion of the circuit board held by the board holding device, and (c) a relative movement device for moving the board holding device and the working head relative to each other. As such a board work system, there is known an adhesive applying system and an electric-component mounting system, for example. In the adhesive applying system, the working head takes the form of an applying head for applying an adhesive to the circuit board. In the electric-component mounting system, the working head takes the form of a mounting head for mounting head the electric component onto the circuit board.

In the board working system, it is common that the circuit board is held at a central or non-peripheral portion of its lower surface by a plurality of supporting members of the board holding device. However, it is not easy to support the circuit board in an appropriate manner, particularly, where the circuit board is made principally of a ceramic material which is inherently brittle or fragile and is accordingly easy to be broken or fractured due to its poor elastic deformability if a large stress or force is applied to the circuit board. A metallic material is conventionally used for forming the supporting members. The circuit board is held by the metallic supporting members at its supported surface (one of its opposite surfaces), so that its work surface (the other of its opposite surfaces) is subjected to the predetermined operation while the circuit board is being supported at its supported surface by the supporting members. This manner for supporting the circuit board is effective for maintaining a horizontal posture of the circuit board without the work surface being inclined with respect to the horizontal direction, but is not effective to prevent vibration of the circuit board which is likely to be caused due to shock acting on the circuit board, for example, upon mounting of the electric component onto the circuit board, upon initiation of movement of the circuit board in a direction parallel to its support or work surface, or upon positioning the circuit board in a desired position after the movement. If the vibration of the circuit board is not settled or stopped by the point of time of the mounting of the electric component onto the circuit board, the electric component could not be accurately positioned relative to the circuit board, thereby making it difficult to mount the electric component in a desired portion of the circuit board with high accuracy.

It is considered possible, for example, to replace the metallic supporting member with a supporting member made of a rubber, sponge or other material capable of absorbing the vibration. However, where the circuit board is slightly convexed in the downward direction (i.e., in a direction away from the work surface toward the supported surface), such a downwardly convexed circuit board could not be sufficiently flattened by the supporting member made of the considerably soft material. Further, where the circuit board is slightly convexed in the upward direction (i.e., in a direction away from the supported surface toward the work surface), the circuit board could not be firmly supported at its supported surface by the metallic supporting member in the above-described manner. A supporting member having a suction cup or surface is widely used for supporting such a upwardly convexed circuit board with application of a vacuum pressure to the supported surface through the suction surface. However, if the circuit board made of a ceramic material is considerably deformed by the application of the vacuum pressure, there caused a risk of fracture of the circuit board. These problems are encountered not only where the circuit board is made of a ceramic material but also where the circuit board is made of other fragile material such as a glass material.

SUMMARY OF THE INVENTION

It is an object of the present invention to provide a fragile-board supporting method, a board supporting device, an electric-circuit manufacturing system, an electric-component mounting system and a board operation system, in which a board made of a brittle or fragile material can be held in an appropriate manner.

The above object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A method of supporting a board made of a fragile material, by a plurality of supporting members formed of respective elastic materials, the method comprising steps of: (a) preparing a plurality of first and second supporting members as the supporting members such that the second supporting members have higher compression modulus than the first supporting members; (b) arranging the first and second supporting members on a plane such that each of the first supporting members is adjacent to a corresponding one of the second supporting members and such that each of the first supporting members has a larger height from the plane than each of the second supporting members; and (c) positioning the first and second supporting members under the board, whereby the board is supported at a lower surface thereof by the supporting members.

For making the compression modulus of each of the second supporting members larger than that of each of the first supporting member, it is preferable to make a cross sectional area of each second supporting member larger than that of each first supporting member, and/or to make a hardness of the material of each second supporting member larger than that of the material of each first supporting member. The term "compression modulus" may be interpreted to mean a ratio of the compressive force applied to the supporting member per unit surface area to the change in volume of the supporting member per unit volume. Further, it is preferable that at least each second supporting member has a flat upper end surface. It is more preferable that each first supporting member, as well as each second supporting member, has a flat upper end surface. The term "flat upper end surface" should be interpreted to mean not only a completely flat surface but also a surface which is slightly concaved or convexed.

In practice of the method according to the invention, there are a case where only the first supporting members are brought into contact with the lower surface of the fragile board, and also a case where the second supporting members as well as the first supporting members are brought into contact with the lower surface of the board. That is, where the lower surface of the fragile board is substantially flat, or where the fragile board is convexed in the downward direction, the first and second supporting members are both brought into contact with the lower surface of the fragile board so that the fragile board is supported by the first and second supporting members. In this instance, the first supporting members are being elastically compressed. On the other hand, where the fragile board is convexed in the upward direction, the first supporting members are brought into contact with the lower surface of the board while the second supporting members are not brought into contact with the lower surface of the board so that the board is supported by only the first supporting members. The heights of the respective first and second supporting members may be adjusted or changed, such that only the first supporting members are brought into contact with the lower surface of the board with the first supporting members being elastically compressed where the lower surface of the board is substantially flat, and such that some of the second supporting members, in addition to the first supporting members, are brought into contact with the lower surface of the board where the board is downwardly convexed in a large amount. Where each second supporting member has a flat upper end surface, the fragile board can be supported at the lower surface by the upper end surface of the second supporting member with a smaller amount of local deformation of the upper end surface of the second supporting member, than where the upper end surface of each second supporting member is concaved or convexed rather than flat. Thus, the flat upper end surface of each second supporting member facilitates accurate positioning of the lower surface of the board. Although the compression modulus of each second supporting member is higher than that of each first supporting member, each second supporting member as well as each first supporting member is elastically deformable. Thus, where the fragile board is downwardly convexed, the second supporting members as well as the first supporting members are compressed upon their contacts with the board, whereby the downwardly convexed board thus supported by the supporting members is somewhat flattened by reaction force which resists the compressive deformation of the supporting members.

Since each of the supporting members is formed of an elastic material, preferably, a rubber or its equivalent material, the fragile board and each supporting member can be brought into contact with each other, without stress concentration in a local portion or portions of contact surfaces of the fragile board and the supporting member, namely, without a risk of fracture of the fragile board. That is, the supporting members formed of the elastic materials provide the fragile board with a condition favorable for execution of a desired operation on the board, even where the fragile board to be held by the supporting members is convexed downwardly or upwardly. It is noted that the elastic material forming each supporting member may have an electric conductivity, for preventing electrification or charging of the board made of an electrically insulating material, by electrically connecting each supporting member with a suitable metallic member.

(2) A method according to mode (1), further comprising a step of holding opposite end portions of the board such that the opposite end portions of the board have the same height from the plane, whereby the board is held at the opposite end portions while being supported at the lower surface.

(3) A method according to mode (1) or (2), wherein the first and second supporting members are prepared, such that each of the first supporting members consists of a columnar member whose cross sectional shape is constant as viewed in a longitudinal direction of the columnar member, and/or such that each of the second supporting members consists of a columnar member whose cross sectional shape is constant as viewed in a longitudinal direction of the columnar member. In the method defined in this mode (3), each first supporting member and/or each second supporting member can be provided by a member having a simple shape.

(4) A method according to any one of modes (1)–(3), wherein the first and second supporting members are regularly arranged on the plane.

The first and second supporting member may be arranged irregularly depending upon the shape and/or size of a particular fragile board, so as to serve for the particular fragile board. However, as in the method defined in this mode (4), it is also possible to regularly arrange the first and second supporting members, so that the supporting members serve for various kinds of fragile boards having different shapes and sizes.

(5) A method according to any one of modes (1)–(4), wherein the plane has a plurality of sections in each of which the first and second supporting members are arranged in accordance with a predetermined pattern, so that the plurality of sections of the plane have the same arrangement of the first and second supporting members.

(6) A method according to any one of modes (1)–(5), wherein the first and second supporting members are arranged on the plane in a staggered pattern.

The number of the first supporting members may be equal to or different from that of the second supporting members. Where the numbers of the respective first and second supporting members are equal to each other, it is preferable that the first and second supporting members arranged on the plane in the staggered pattern, as in this mode (6), for equalizing the density of the first supporting members and that of the second supporting members to each other in any local portions of the plane.

(7) A method according to any one of modes (1)–(6), wherein the first and second supporting members arranged on the plane, such that each of the first supporting members is closer to one of the second supporting members than to any one of the other first supporting members, and such that each of the second supporting members is closer to one of the first supporting members than to any one of the other second supporting members.

(8) A board supporting device comprising: (a) a plurality of first supporting members formed of an elastic material; (b) a plurality of second supporting members formed of an elastic material and having higher compression modulus than the first supporting members; and (c) a supporting-members holding member which holds the first and second supporting members, wherein the supporting members are arranged on the supporting-members holding member such that each of the first supporting members is adjacent to a corresponding one of the second supporting members, and wherein the supporting members project from the supporting-members holding member such that a distal end of each of the first supporting members lies on a plane while a distal end of each of the second supporting members lies on one of opposite sides of the plane which is closer to the supporting-members holding member.

The board supporting device of this mode (8) is advantageously used for mainly supporting a board made of a fragile material. However, this board supporting device can be used for supporting a board made of other material such as a synthetic resin. Also in this case, the board supporting device provides the same technical advantages as in the case where the board supporting device is used for supporting the fragile board. It is noted that each of the features defined in the above-described modes (2)–(7) may be applied also to the board supporting device of this mode (8).

(9) A board supporting device according to mode (8), wherein the supporting-members holding member includes a substantially flat plate.

(10) A board supporting device according to mode (9), wherein the flat plate has a plurality of receiving holes formed therein, and wherein each of the supporting members is received at a proximal end portion thereof in a corresponding one of the receiving holes.

The supporting-members holding member can be provided by a simple construction in which the first and second supporting members are received in the respective receiving holes formed in the flat plate, as in the board supporting device of this mode (10). Each of the supporting members may be formed by vulcanizing a rubber material provided in the corresponding receiving hole, so that the supporting member is fixed to the flat plate, simultaneously with the formation of the supporting member in a vulcanization process. Alternatively, each of the supporting members may be fixed to the flat plate by introducing each supporting member into the corresponding receiving hole, after the supporting members have been formed independently of each other. In the latter case, it is preferable but not essential to use a boding agent for fixing each of the supporting members to the flat plate.

(11) A board supporting device according to mode (10), wherein the proximal end portion of each of the first supporting members has a thickness which is equal to that of the proximal end portion of each of the second supporting members, and each of the first supporting members has a distal end portion whose thickness is smaller than that of a distal end portion of each of the second supporting members.

In the board supporting device of this mode (11) in which the plurality of receiving holes formed in the flat plate may be identical to each other, the first supporting members are received in selected ones of the receiving holes while the second supporting members are received in the other receiving holes, such that the first and second supporting members are distributed in a desired pattern.

(12) A board supporting device according to mode (10), wherein the receiving holes includes first holes and second holes each of which has an inner dimension larger than that of each of the first holes, wherein each of the first supporting members has a thickness which is constant as viewed in a projection direction in which each of the supporting members projects from the flat plate, while each of the second supporting members has a thickness which is constant as viewed in the projection direction and which is larger than the thickness of each of the first supporting members, and wherein the first supporting members are received in the first holes while the second supporting members are received in the second holes.

In the board supporting device of this mode (12), each of the first and second supporting members may be provided by a member having a simple columnar shape, whereby the board supporting device can be manufactured at a low cost.

(13) A board supporting device according to any one of modes (8)–(12), wherein each of the elastic materials forming the first and second supporting members has a loss factor or loss tangent (tan δ) not smaller than 0.5, preferably not smaller than 0.7, more preferably not smaller than 0.9, as measured when the elastic material is subjected to vibration of 110 Hz at a temperature of 20° C.

It is possible to use, as the elastic material having the above-described value of loss tangent, a commercially available damping rubber (e.g., "HANENITE" manufactured by NAIGAI Co., Ltd., Japan). Where each first supporting member and/or each second supporting member are formed of the elastic material having a large value of loss tangent, the vibration of the fragile board is rapidly damped, thereby making it possible to avoid increase in the amplitude of the vibration.

(14) A method of manufacturing an electric circuit by using a mounting head which is capable of carrying an electric component from a component supplying device to a board made of a fragile material, so as to mount the electric component on the board, the method comprising a step of supporting the board by a plurality of first supporting members and a plurality of second supporting member, wherein the first supporting members are formed of an elastic material, while the second supporting members are formed of an elastic material and have higher compression modulus than the first supporting members, and wherein the supporting members project from a supporting-members holding member such that a distal end of each of the first supporting members lies on a plane while a distal end of each of the second supporting members lies on one of opposite sides of the plane which is closer to the supporting-members holding member.

Each of the features defined in the above-described modes (2)–(7) and (9)–(13) may be applied also to the electric-circuit manufacturing method of this mode (14).

(15) A method according to mode (14), wherein the board is supported at one of opposite surfaces thereof by the first and second supporting members, the method further comprising a step of holding opposite end portions of the board such that the opposite end portions of the board have the same distance from the plane, whereby the board is held at the opposite end portions while being supported at the one of the opposite surfaces.

(16) An electric-component mounting system comprising: (a) a component supplying device capable of supplying an electric component; (b) a board holding device capable of holding a circuit board; (c) a component mounting device capable of receiving the electric component from the component supplying device and mounting the electric component on the circuit board held by the board holding device, wherein the board holding device includes (i) plurality of first supporting members formed of an elastic material, and (ii) a plurality of second supporting members formed of an elastic material and having higher compression modulus than the first supporting members, and wherein the first and second supporting members are arranged on a plane such that each of the first supporting members has a larger height from the plane than each of the second supporting members.

Each of the features defined in the above-described modes (2)–(7) and (9)–(13) may be applied also to the electric-component mounting system of this mode (16).

(17) An electric-component mounting system according to mode (16), wherein the board holding device further includes a board holding mechanism which is capable of holding opposite end portions of the board such that the opposite end portions of the board have the same height from the plane, and wherein the first and second supporting members are positioned relative to the board holding mechanism such that the board can be supported at a lower surface thereof by the supporting members while being held at the opposite end portions by the board holding mechanism.

(18) A board work system comprising: (a) a board holding device capable of holding a circuit board; (b) a working head capable of achieving a predetermined work in a desired portion of the circuit board held by the board holding device, and (c) a relative movement device capable of moving the board holding device and the working head relative to each other, wherein the board holding device includes (i) plurality of first supporting members formed of an elastic material, (ii) a plurality of second supporting members formed of an elastic material and having higher compression modulus than the first supporting members, and (iii) a supporting-members holding member which holds the first and second supporting members, and wherein the supporting members project from the supporting-members holding member such that a distal end of each of the first supporting members lies on a plane while a distal end of each of the second supporting members lies on one of opposite sides of the plane which is closer to the supporting-members holding member.

Each of the features defined in the above-described modes (2)–(7) and (9)–(13) may be applied also to the board work system of this mode (18).

(19) A board work system according to mode (18), wherein the board holding device further includes a board holding mechanism which is capable of holding opposite end portions of the board such that the opposite end portions of the board have the same distance from the plane, and wherein the first and second supporting members are positioned relative to the board holding mechanism such that the board can be supported at one of opposite surfaces thereof by the supporting members while being held at the opposite end portions by the board holding mechanism.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Hereinafter, there will be described an electric-component mounting system which is equipped with a circuit-board supporting device constructed according to an embodiment of the present invention. This electric-component mounting system is capable of carrying out the fragile-material-made board supporting method which is defined in the above-described modes (1)–(7) and also the electric-circuit manufacturing method which is defined in the above-described modes (14)–(15).

Figure 1:
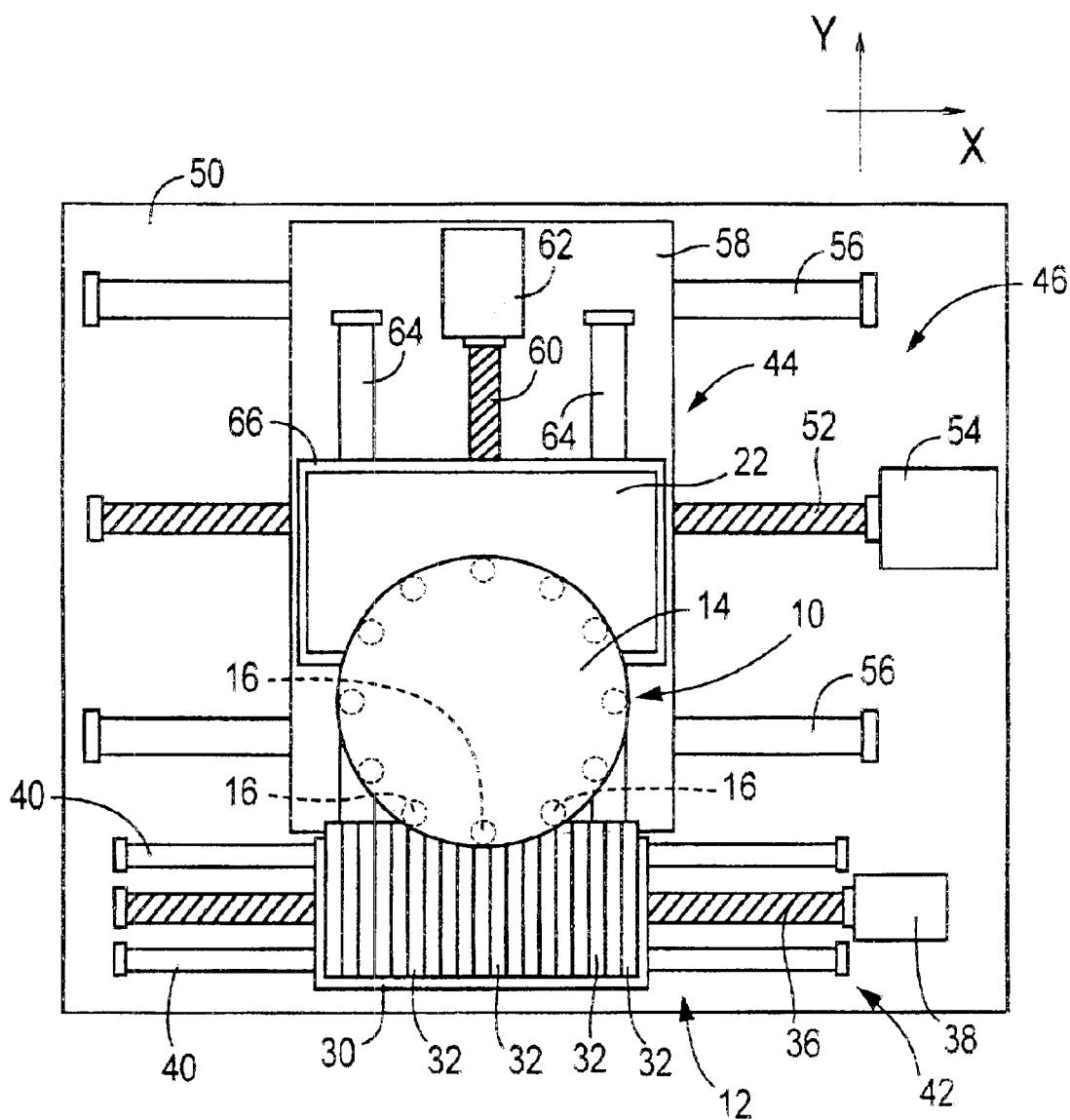
FIG. 1 is a schematic upper plan view of an electric-component mounting system equipped with a circuit-board supporting device which is constructed according to an embodiment of the invention and which is capable of advantageously carrying out a fragile-board supporting method and an electric-circuit manufacturing method which are arranged according to the invention.

The electric-component mounting system includes a component mounting device 10 and a component supplying device 12 as shown in FIG. 1. The component mounting device 10 includes an index table 14 which is intermittently rotatable about a vertical axis line. The index table 14 has a plurality of component suction heads 16 each of which serves as a mounting or working head and is capable of sucking and holding an electric component by applying a negative air pressure to the electric component. The index table 14 holds the component suction heads 16 such that the suction heads 16 are equi-angularly spaced from one another about the vertical axis line. The index table 14 is intermittently rotated by an intermittently rotating device (not shown) including a cam, a cam follower, a rotary shaft, and an indexing servomotor for rotating the cam. With the intermittent rotation of the index table 14, the component suction heads 16 are sequentially Moved to each of a plurality of operation positions such as a component sucking position (i.e., a component picking position), a component-posture detecting position, a component-posture correcting position, and a component mounting position. Each of the suction heads 16 is positioned in the selected one of the operating positions, so that the suction head 16 carries out the corresponding operation in the position. When the suction head 16 is positioned in the component mounting position, for example, the suction head 16 mounts the electric component on a printed circuit board ("PCB") 22 which has a substantially rectangular shape. It is noted that the PCB 22, as a sort of circuit board, consists of a ceramic board made principally of a brittle or fragile material in the form of a ceramic material in the present embodiment. In this respect, the PCB 22 will be referred to as "ceramic board 22" in the following descriptions.

The component supplying device 12 includes a plurality of component feeders 32 each of which is detachably attached to a feeder supporting table 30. The component feeders 32 are supported on the supporting table 30 such that component-supply portions of the respective feeders 32 are arranged along a straight line on a horizontal plane (hereinafter, a direction parallel to this straight line is referred to as the "X-axis direction"). As a ball screw 36 is rotated by an X-axis servomotor 38, the feeder supporting table 30 is moved in the X-axis direction while being guided by a pair of guide rails 40. Thus, the component supplying portion of a selected one of the component feeders 32 is moved to a component supplying position. The ball screw 36 and the X-axis servomotor 38 cooperate with each other to provide a table moving device 42 for moving the feeder supporting table 30. In the present embodiment, each of the component feeders 32 includes a tape feeding device as a sort of component feeding device, and a tape-reel holding device as a sort of component storing device, and supplies a plurality of electric components by an electric-component carrier tape. The tape feeding device and the tape-reel holding device are provided on a common main frame of the each component feeder 32.

The ceramic board 22 is supported by a board positioning and holding device 46 including a horizontal movement device 44, and is moved to an arbitrary position on an X-Y plane by the board positioning and holding device 46. The ceramic board 22 is carried or loaded by a board loading device (not shown), onto the board positioning and holding device 46 which is disposed together with the component mounting device 10 and the component supplying device 12 on a common base 50. The ceramic board 22 is carried or unloaded by a board unloading device (not shown) from the board positioning and holding device 46. The board loading and unloading devices include respective conveyor belts for conveying the ceramic board 22 in the X-axis direction. As shown in FIG. 1, the horizontal movement device 44 includes an X-axis feed screw in the form of a ball screw 52 provided on the base 50, an X-axis servomotor 54 for rotating the ball screw 52, an X table 58 which is to be moved in the X-axis direction, a Y-axis feed screw in the form of a ball screw 60 provided on the X table 58, a Y-axis servomotor 62 for rotating the ball screw 60, and a Y table 66 which is to be moved in a Y-axis direction that is perpendicular to the X-axis direction. As the ball screw 52 is rotated by the X-axis servomotor 54, the X table 58 is moved in the X-axis direction while being guided by a pair of guide rails 56. Similarly, as the ball screw 60 is rotated by the Y-axis servomotor 62, the Y table 66 is moved in the Y-axis direction while being guided by a pair of guide rails 64. Each of the servomotors 38, 54, 62 is a sort of electric motor as a drive source, and is an electric rotary motor which is precisely controllable with respect to its rotation angle or amount. The servomotors 38, 54, 62 may be replaced with stepping motors, and the electric rotary motors 38, 54, 62 may be replaced with linear motors.

Figure 2:
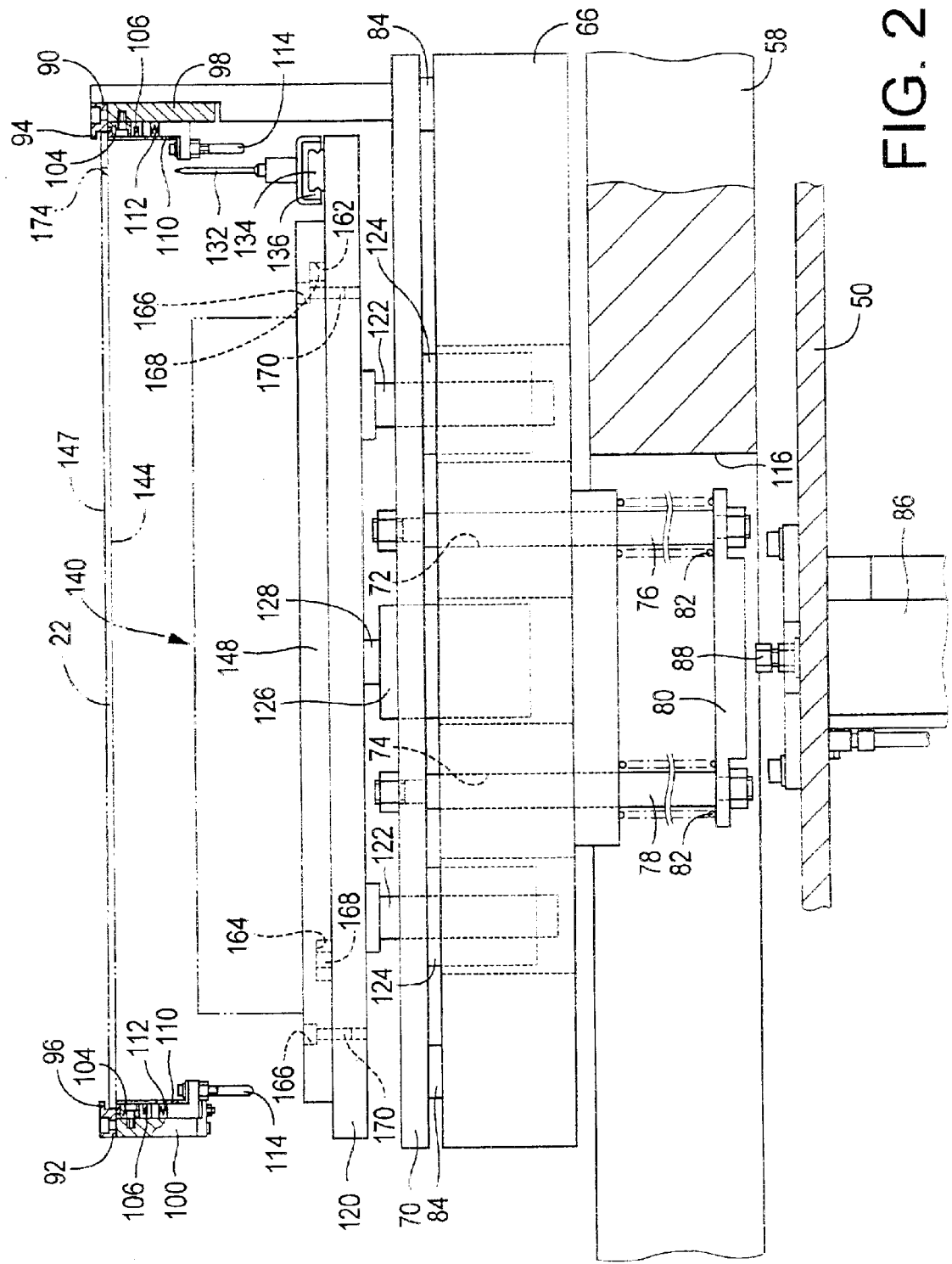
FIG. 2 is a partly cross-sectioned, side view of the above-described circuit-board supporting device.

As shown in FIG. 2, on the Y table 66, there is provided a first elevator table 70 such that the first elevator table 70 is immovable in the X-axis and Y-axis directions relative to the Y table 66 and is movable in a vertical direction, i.e., a Z-axis direction perpendicular to the X-axis and Y-axis directions relative to the Y table 66. The Y table 66 has a pair of through-holes 72, 74 which are formed through its thickness in the Z-axis direction. A pair of rods 76, 78 are provided to extend through the respective through-holes 72, 74 such that each of the rods 76, 78 is movable in its axial direction relative to a corresponding one of the holes 76, 78. The first elevator table 70 is fixed to respective upper end portions of the two rods 76, 78 that project upwardly from the Y table 66.

Respective lower end portions of the two rods 76, 78 that project downwardly from the Y table 66 are connected to each other though a connection bar 80. Two compression coil springs 82 each serving as an elastic member as a sort of biasing device are fitted on the respective lower end portions of the two rods 76, 78 that project downwardly from the Y table 66. Respective lower ends of the two springs 82 are seated on the connection bar 80. Owing to respective biasing forces of the two springs 82, the first elevator table 70 is held in its lower movement end position in which the first elevator table 70 is held in contact with stoppers 84 provided on the Y table 66. On the base 50, there is provided an air cylinder 86 as a sort of fluid-pressure-operated cylinder device as a drive source. The connection bar 80 can be lifted up by an adjusting bolt 88 fixed to a piston rod of the air cylinder 86, so that the first elevator table 70 is moved to its upper movement end position where the first elevator table 70 is separated from the Y table 66 by a predetermined distance in the upward direction.

On the first elevator table 70, there are provided a fixed guide 90 and a movable guide 92. Each of the fixed and movable guides 90, 92 consists of an elongated member having a rectangular cross section. The two guides 90, 92 include respective hold-down portions 94, 96 projecting from their respective upper end portions. The fixed guide 90 is fixed to a plate-like supporting member 98 such that the fixed guide 90 extends parallel to the X-axis direction. The supporting member 98 is fixed to one of two sides of the first elevator table 70 that are parallel to the X-axis direction, such that the supporting member 98 extends parallel to the X-axis direction. The movable guide 92 is fixed to another supporting member 100. Two slide members (not shown) are fitted in respective grooves which are formed in an upper surface of the first elevator table 70 and which are spaced apart from each other in the X-axis direction, such that the two slide members are movable in the Y-axis direction. The supporting member 100 is fixed at its lengthwise opposite end portions to respective upper end portions of the two slide members, so that the supporting member 100 extends parallel to the X-axis direction and accordingly the movable guide 92 also extends parallel to the X-axis direction. With the movement of the slide members, the movable guide 92 is moved toward and away from the fixed guide 90, whereby a distance between the fixed and movable guides 90, 92 is adjusted depending upon the size of the ceramic board 22 which is to be guided by the fixed and movable guides 90, 92.

Two belt guides 104 are fixed, below the two hold-down portions 94, 96, to respective upper end portions of respective inner surfaces of the two supporting members 98, 100 which surfaces are opposed to each other. Two endless conveyor belts 106 are wound on the two belt guides 104, respectively. The two conveyor belts 106 are driven or circulated in synchronization with each other by a belt drive device (not shown) including a drive motor as a drive source. Two projecting members 110 are fitted in the respective two supporting members 98, 100, respectively, such that each of the projecting members 110 is movable upwardly and downwardly. Each of the two projecting members 110 consists of a plate-like member which is elongated in the X-axis direction, is located inside a corresponding one of the two conveyor belts 106, and is biased downward by a coil spring 112. The end of downward movement of each projecting member 110 by the biasing force of the corresponding spring 112 is defined by a stopper (not shown). In the state in which the two projecting members 110 are held in their lower movement end position, respective upper ends of the projecting members 110 are substantially level with respective upper flat portions of the two endless conveyor belts 106. Two engaging pins 114 are fixed to opposite ends of each projecting member 110, respectively, that are distant from each other in the X-axis direction, such that each of the engaging pins 114 extends downwardly.

In the state in which the first elevator table 70 is held in its lower movement end position as shown in FIG. 2, the first elevator table 70 and the ceramic board 22 placed on the first elevator table 70 are positioned below the above-described board loading and unloading devices, and are moved with the Y table 66 in the X-axis and Y-axis directions without being interfered by the board loading and unloading devices. The X table 58 has an opening 116 which is elongated in the Y-axis direction and which permits the rods 76, 78 (projecting downwardly from the Y table 66) and the connection bar 80, to be moved together with the Y table 66 in the Y-axis direction.

In the state in which the first elevator table 70 is held in its home position (in which the first elevator table 70 is aligned with the board loading and unloading devices as viewed in the Y-axis direction, is positioned between the board loading and unloading devices as viewed in the X-axis direction, and is held in its upper movement end position by the air cylinder 86), the height position of respective board-convey surfaces of the two conveyor belts 106 that are defined by respective upper surfaces of the respective upper flat portions of the two belts 106 is the same as the height position of respective board-convey surfaces of two conveyor belts of the board loading device that are defined by respective upper surfaces of respective upper flat portions of the two belts, and the height position of respective board-convey surfaces of two conveyor belts of the board unloading device that are defined by respective upper surfaces of respective upper flat portions of the two belts. That is, at this home position, the first elevator table 70 receives the board 22 from the board loading device and discharges the board 22 to the board unloading device.

On the first elevator table 70, there is provided a second elevator table 120 consisting of a plate-like member, such that the second elevator table 120 can be elevated and lowered. A pair of guide rods 122 serving as guide members are fixed to a lower surface of the second elevator table 120. The two guide rods 122 are fitted in respective guide bushings 124 which are fixed to a lower surface of the first elevator table 70, such that each of the guide rods 122 is movable in its axial direction relative to a corresponding one of the guide bushings 124. The guide bushings 124 are accommodated in respective holes formed through the thickness of the Y table 66, such that each of the bushings 124 is movable upwardly and downwardly. A piston rod 128 of an air cylinder 126 as a sort of fluid-pressure-operated actuator as a drive source, and also as a sort of fluid-pressure-operated cylinder device, is fixed to the lower surface of the second elevator table 120. The air cylinder 126, which is of a single action type, is fixed to the first elevator table 70 such that the air cylinder 126 extends in a vertical direction, and is accommodated in a hole formed through the thickness of the Y table 66, such that the air cylinder 126 is movable upwardly and downwardly relative to the Y table 66. When the piston rod 128 is extended out by a biasing force of a spring provided in a housing of the cylinder 126, the second elevator table 120 is moved upwardly relative to the first elevator table 70. When compressed air is supplied to an air chamber provided in the housing, the piston rod 128 is retracted into the housing whereby the second elevator table 120 is moved downwardly relative to the first elevator table 70. A lower movement end position of the second elevator table 120 is defined by a stroke end of a piston (not shown) of the air cylinder 126.

As shown in FIG. 2, on the second elevator table 120, there are provided a main positioning pin (not shown) and an auxiliary positioning pin 132 which cooperate with each other to position the ceramic board 22 on a horizontal plane. The main and auxiliary positioning pins 132 are provided on the side of the fixed guide 90. The main positioning pin is fixed to the second elevator table 120, and the auxiliary positioning pin 132 is provided on the second elevator table 120 such that the auxiliary positioning pin 132 is movable in the X-axis direction. A guide rail 134 is fixed to the second elevator table 120 such that the guide rail 134 extends in the X-axis direction, and a block member 136 is fitted on the guide rail 134 such that the block member 136 is movable in the X-axis direction. The auxiliary positioning pin 132 is fixed to the block member 136, so that the auxiliary positioning pin 132 is movable toward and away from the main positioning pin in the X-axis direction. The position of the auxiliary positioning pin 132 is adjusted depending upon the size of the ceramic board 22.

Figure 3:
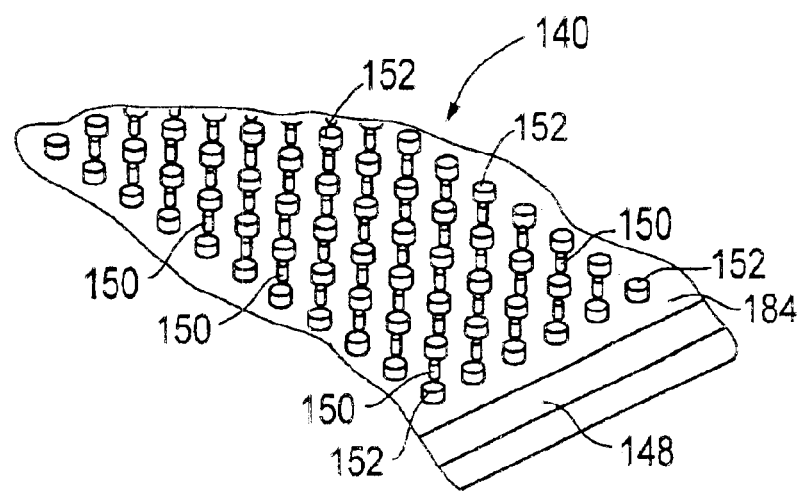
FIG. 3 is a perspective view of first and second supporting members of the circuit-board supporting device.

On the second elevator table 120, a board supporting device 140 is provided in an area which is defined by a two-dot chain line in FIG. 2. The ceramic board 22 is supported at a lower one 144 of its opposite surfaces by the board supporting device 140, so that an electric component (not shown) is mounted onto an upper one 147 of the opposite surfaces. The lower and upper surfaces 144, 147 may be referred to as a supported surface and a work surface, respectively. As shown in FIG. 3, the board supporting device 140 includes a holding plate 148 which serves as a supporting-members holding member, and first and second supporting members 150, 152 which are held by the holding plate 148, namely, which are fixed to one of opposite surfaces of the holding plate 148.

The holding plate 148 consists of a generally rectangular plate which is formed of a synthetic resin such as a phenolic resin. The holding plate 148 has two pairs of first and second positioning recesses 162, 164 which are formed in the other of the above-described opposite surfaces of the holding plate 148. Each of the first positioning recesses 162 has a circular cross section, while each of the second positioning recesses 164 has an elliptic cross section. The holding plate 148 further has bolt holes 166 formed through its thickness. The first and second supporting members 150, 152 will be described later in detail.

On the upper surface of the second elevator table 120, there formed two pairs of positioning projections 168 each of which has a circular cross section. Each pair of projections 168 are fitted in the corresponding pair of first and second recesses 162, 164, respectively, whereby the holding plate 148 or the board supporting device 140 is positioned relative to the second elevator table 120. In this sense, the positioning recesses 162, 164 and projections 168 cooperate with each other to constitute a positioning mechanism for positioning the board supporting device 140 and the second elevator table 120 relative to each other. The board supporting device 140 and the second elevator table 120, which are thus positioned relative to each other, are fixed to each other by screw bolts 170 which pass through the respective bolt holes 166 and are screwed into the second elevator table 120.

The above-described positioning mechanism is not particularly limited but may be modified. For example, the above-described recesses 162, 164 may be replaced with through-holes which are formed through the thickness of the holding plate 148. In addition, the positioning projections 168 may be replaced with positioning pins which are to be fitted into the recesses or holes formed in the holding plate 148. Moreover, the holding plate 148 may be provided with positioning projections or pins, while the second elevator table 120 may be provided with positioning recesses or through-holes, such that the positioning projections or pins provided in the holding plate 148 are fitted in the positioning recesses or through-holes provided in the second elevator table 120.

When the ceramic board 22 is to be loaded onto the board positioning and holding device 46, the conveyor belts of the board loading device and the board positioning and holding device 46 are driven or circulated. In this instance, the first elevator table 70 is held in its upper movement end position, while the second elevator table 120 is held in its lower movement end position. Thus, as the conveyor belts are circulated, the ceramic board 22 is loaded onto the board positioning and holding device 46 from the board loading device. The loading movement of the ceramic board 22 is stopped by a stopper (not shown) which is positioned in an operative position. After the conveyor belts 106 are stopped, the second elevator table 120 is moved upwardly relative to the first elevator table 70. When the second elevator table 120 is being elevated, the second elevator table 120 is brought into engagement with the engaging pins 114, thereby causing the projecting members 110 to be moved upwardly against the biasing forces of the coil springs 112, and then lifting the ceramic board 22 up away from the conveyor belts 106. As the second elevator table 120 is elevated, the main and auxiliary board positioning pins 132 and the board supporting device 140 are elevated, so that the positioning pins 132 are fitted in a main positioning hole (not shown) and an auxiliary positioning hole 174, for thereby positioning the ceramic board 22 relative to the second elevator table 120. When the ceramic board 22 is thus poisoned relative to the second elevator table 120, the ceramic board 22 is supported at its lower surface 144 by the first and second board supporting members 150, 152 of the board supporting device 140 which are brought into contact with the lower surface 144. The construction or arrangement in which the ceramic board 22 is supported by the first and second board supporting members 150, 152 of the board supporting device 140 will be described later in detail.

When the ceramic board 22 is lifted up by the projecting members 110 and then brought into contact with the hold-down portions 94, 96, the first and second supporting members 150, 152 are also brought into contact with the ceramic board 22 while the main and auxiliary positioning pins 132 are fitted into the main and auxiliary positioning holes 174 to position the ceramic board 22 relative to the second elevator board 120. In other words, the ceramic board 22 is positioned by the positioning pins 132, while the ceramic board 22 is gripped at its opposite end portions (as viewed in a width direction of the board 22, i.e., in a direction parallel with the Y-axis direction) by and between the hold-down portions 94, 96 and the projecting members 110 and is also supported at its lower surface 144 by the first and second board supporting members 150, 152. The hold-down portions 94, 96 and the projection members 110 cooperate with each other to provide a board holding mechanism. It should be noted that the ceramic board 22 does not have to be necessarily gripped at its opposite surfaces 144, 147 by the hold-down portions 94, 96 and the projection members 110 but may be simply held at only its upper surface 147 by the hold-down portions 94, 96. In this sense, the projection members 110 are not essential for holding the ceramic board 22. It is also noted that the board holding mechanism may be provided by, in place of the hold-down portions 94, 96 and the projection members 110, a plurality of clamping jaws each of which is pivotable or movable between its clamping and unclamping positions by a driving device, as disclosed in JP-A-H11-145681 (publication of Japanese Patent application laid open in 1999).

Subsequently, the first elevator table 70 is lowered to its lower movement end position. When the electric component is to be mounted on the ceramic board 22, the X table 58 and the Y table 66 are moved for positioning the ceramic board 22 in a desired position on a horizontal plane. Thus, it can be said that the first elevator table 70 provides a movable table which supports and moves the ceramic board 22, or it can be said that the second elevator table 120 provides the movable table. Otherwise, it can be said that the first and second elevator tables 70, 120 cooperate with each other to provide the movable table, or it can be said that the Y table 66 provides the movable table which supports the ceramic table 22 via the first and second elevator tables 70, 120.

The plurality of suction heads 16 of the component mounting device 10 are sequentially positioned in the component sucking position, as the index table 14 is intermittently rotated. In the component sucking position, each of the component suction heads 16 sucks and holds the electric component from the component supplying portion of one of the component feeders 32 which is currently positioned in the component supplying position. Subsequently, each suction head 16 is moved to the component mounting position via the component-posture detecting position and the component-posture correcting position. In the component mounting position, each suction head 16 mounts the electric component on the upper surface 147 of the ceramic board 22. Each suction head 16 is supported by the index table 14 such that the each head 16 can be lowered and elevated relative to the index table 14, for sucking or mounting the electric component.

After all the electric components to be mounted on the ceramic board 22 have been mounted on the ceramic board 22, the X and Y tables 58, 66 are returned to their home positions in which the ceramic board 22 is loaded onto or unloaded from the board positioning and holding device 46 by the board loading device or board unloading device. Then, the first elevator table 70 is moved upwardly to its upper movement end position while the second elevator table 120 is moved downwardly to its lower movement end position, so that the main and auxiliary positioning pins 132 are removed from the main and auxiliary positioning holes 174 while the first and second supporting members 150, 152 of the board supporting device 140 are separated from the lower surface 144. Further, in this instance, the projecting members 110 are moved away from the hold-down portions 94, 96, whereby the ceramic board 22 is released from the board positioning and holding device 46. After the ceramic board 22 has been thus released from the board positioning and holding device 46, the conveyor belts of the board unloading device and the conveyor belts of the board positioning and holding device 46 are driven or circulated, so that the ceramic board 22 is unloaded from the board positioning and holding device 46 to the board unloading device. After the unloading of the ceramic board 22, or concurrently with the unloading of the ceramic board 22, another ceramic board 22 on which the electric components are next to be mounted is loaded onto the board positioning and holding device 46.

The holding plate 148 of the board supporting device 140 is smaller than the second elevator table 120, so that the engaging pins 114 are brought into contact with respective portions of the second elevator table 120 which are not covered by the holding plate 148, as is apparent from FIG. 2. As described above, the distance between the fixed guide 90 and the movable guide 92 (i.e., a board-guide width) is adjustable by moving the pair of block members (not shown) relative to the first elevator table 70 in the Y-axis direction. Since those block members are provided outside the second elevator table 120 as viewed in the X-axis direction and the movable guide 92 crosses over the second elevator table 120, the movable guide 92 does not interfere with the second elevator table 120 and the board supporting device 140 when the board-guide width is adjusted or changed. That it, even in the case where there is a size difference between the ceramic boards 22, the same second elevator table 120 can be used for such ceramic boards 22 having respective different sizes. Further, even in such a case, the same holding plate 148 of the board supporting device 140 can be used, by simply changing the arrangement or sizes of first and second supporting members 150, 152.

Each of the first and second supporting members 150, 152 is formed of an elastic material, e.g., a rubber or its equivalent material. In the present embodiment, each of the first and second supporting members 150, 152 is formed of a vibration damping rubber having a loss factor or loss tangent tan δ not smaller than 0.5. This vibration damping rubber exhibits an excellent impact and vibration absorbing ability, and reacts little to an external force applied thereto so as to absorb the external energy. As such a vibration damping rubber, it is possible to employ a commercially available damping rubber (e.g., "HANENITE" manufactured by NAIGAI Co., Ltd., Japan). This vibration damping rubber has physical properties and durability comparable to those of standard rubbers, and exhibits an excellent vibration damping ability at an ordinary temperature range of 5–35° C., and an impact resilience smaller than 10%. Further, this vibration damping rubber has a high degree of moldability as standard rubbers, and is firmly adherable to a metal member. Still further, where this vibration damping rubber is provided in the form of a sheet, it can be easily cut, blanked or punched.

Figure 4:
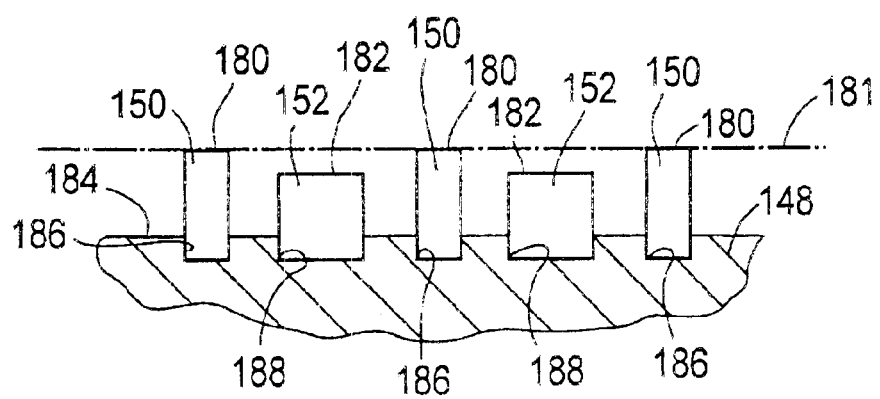
FIG. 4 is a front view in cross section of the first and second supporting members of FIG. 3.

Each of the first and second supporting members 150, 152 consists of a vertically extending columnar or cylindrical member whose cross sectional shape is constant as viewed in its longitudinal or axial direction, as shown in FIG. 4. Each second supporting member 152 has a thickness or diameter larger than that of each first supporting member 150, and a smaller height or axial length from the plane of the holding plate 148 than that of each first supporting member 150, so that a distal end of each first supporting member 150 lies on a plane which is represented by a chain line denoted by the reference numeral 181, while a distal end of each second supporting member 152 lies on a lower side of the plane 181, i.e., on one of opposite sides of the plane 181 which is closer to the holding plate 148. Each first supporting member 150 and each second supporting member 152 have respective upper end surfaces 180, 182 each of which consists of a flat surface perpendicular to the axial direction. Each second supporting member 152 is adapted to have a compression modulus higher than that of each first supporting member 150. In the present embodiment, the damping rubber forming each second supporting member 152 has a higher degree of hardness than the damping rubber forming each first supporting member 150 so that the compression modulus of each second supporting member 152 is made larger than that of each first supporting member 150.

The first and second supporting members 150, 152 are regularly arranged on a holding surface 184 which is provided by an upper surface of the holding plate 148 and which is to be brought parallel with the lower surface 144 of the ceramic board 22, such that each of the first supporting members 150 is adjacent to a corresponding one of the second supporting members 152. In the present embodiment, the holding surface 184 has a plurality of sections in each of which the first and second supporting members 150, 152 are arranged in accordance with a predetermined pattern, so that the plurality of sections of the holding surface 184 have the same arrangement of the first and second supporting members 150, 152. Described more specifically, the supporting members 150, 152 are arranged on the holding surface 184 in a zigzag or staggered pattern, such that the first supporting members 150 are arranged in a plurality of first lines in each of which each adjacent pairs of the first supporting members 150 are spaced apart from each other at a predetermined pitch, and such that the second supporting members 152 are arranged in a plurality of second lines in each of which each adjacent pairs of the second supporting members 150 are spaced apart from each other at a predetermined pitch. The first and second lines are alternately arranged and parallel with each other, and the predetermined pitch between the adjacent pair of first supporting members 150 is substantially equal to the predetermined pitch between the adjacent pair of second supporting members 152. Each of the first supporting members 150 is offset from ones of the second supporting members 152, which are adjacent to the first supporting member 150, by a distance corresponding to a half of the above-described predetermined pitch as viewed in a direction parallel with the first and second lines. In this arrangement, each of the first supporting members 150 is closer to at least one of the second supporting members 152 than to any one of the other first supporting members 150, and such that each of the second supporting members 152 is closer to at least one of the first supporting members 150 than to any one of the other second supporting members 152.

The first and second supporting members 150, 152 may be fixed to the holding plate 148 by a bonding agent or other suitable means. In the present embodiment, the holding plate 148 has a plurality of first and second receiving holes 186, 188 which are formed in the holding surface 184. Like the first and second supporting members 150, 152, the first and second receiving holes 186, 188 are arranged on the holding surface 184 in the staggered pattern. Each of the first receiving holes 186 has an inner dimension or inside diameter which is smaller than that of each of the second receiving holes 188 and which is slightly larger than the outside diameter of each of the first supporting members 150. Each of the second receiving holes 188 has an inner dimension or inside diameter which is slightly larger than the outside diameter of each of the second supporting members 152. The first and second supporting members 150, 152 are fitted, at their respective proximal end portions, into the receiving holes 186, 188, with the proximal end portions being bonded to the receiving holes 186, 188, whereby the first and second supporting members 150, 152 are fixed to the holding plate 148. It is noted that the first and second supporting members 150, 152 may be press-fitted into the receiving holes 186, 188, so that the first and second supporting members 150, 152 can be fixed to the holding plate 148 without using a boding agent.

Figure 7:
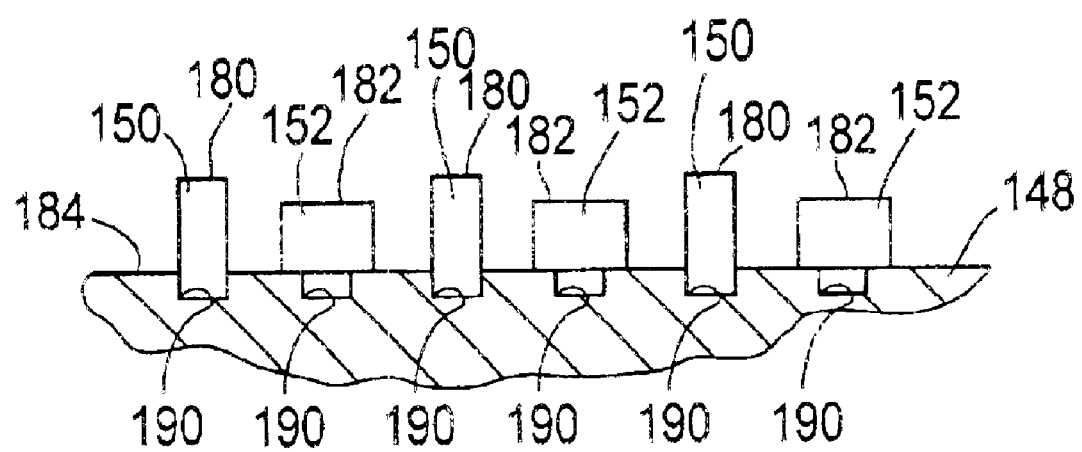
FIG. 7 is a front view in cross section of a modification of the supporting members of FIG. 4.

In the present embodiment, each of the supporting members 150, 152 consists of the vertically extending cylindrical member whose cross sectional shape or diameter is constant as viewed in its axial direction. However, each of the supporting members 150, 152 may have a cross sectional shape or diameter is changed as viewed in the axial direction. For example, as shown in FIG. 7, each of the second supporting members 152 may be modified such that the diameter of the proximal end portion is reduced to equal to the diameter of each of the first supporting members 150. In this arrangement of FIG. 7, all the supporting members 150, 152 have the same diameter in their proximal end portions, so that the supporting members 150, 152 can be received in respective receiving holes 190 which have the same inside diameter and which are arranged on the holding surface 184 of the holding plate 148 in the staggered pattern.

Figure 5:
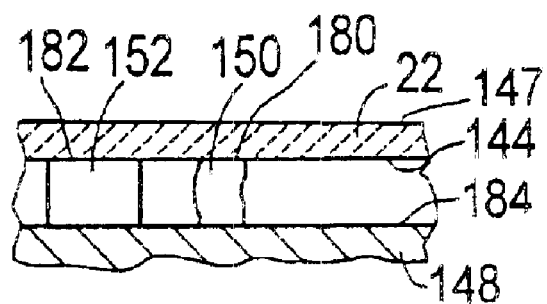
FIG. 5 is a front view in cross section of the first and second supporting members of FIG. 3 when a downwardly convexed board is held by the first and second supporting members.
Figure 6:
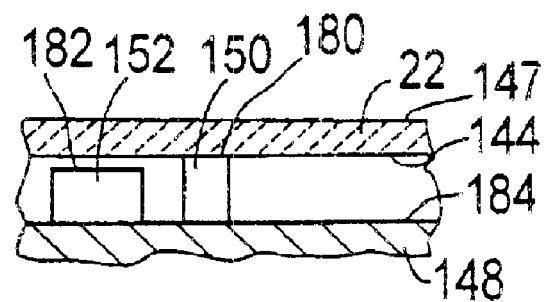
FIG. 6 is a front view in cross section of the first and second supporting members of FIG. 3 when an upwardly convexed board is held by the first and second supporting members.

The ceramic board 22 can be reliably supported by the supporting members 150, 152 of the board supporting device 140, even where the ceramic board 22 is upwardly or downwardly convexed. Where the lower surface 144 of the ceramic board 22 is substantially flat, or where the lower surface 144 is downwardly convexed as shown in FIG. 5, the ceramic board 22 is supported at the lower surface 144 by the upper end surfaces 180, 182 of the first and second supporting members 150, 152, with the first supporting members 150 being elastically compressed. In this instance, both of the upper end surfaces 180, 182 of the first and second supporting members 150, 152 are held in contact with the lower surface 144 of the ceramic board 22. Where the ceramic board 22 is upwardly convexed as shown in FIG. 6, on the other hand, the ceramic board 22 is supported at the lower surface 144 by only the upper end surfaces 180 of the first supporting members 150. In this instance, the upper end surfaces 180 of the first supporting members 150 are held in contact with the lower surface 144 of the ceramic board 22, while the upper end surfaces 182 of the second supporting members 152 are spaced apart from the lower surface 144 of the ceramic board 22.

The ceramic board 22 tends to be subjected to vibration during the operation of the electric-component mounting system, for example, when the index table 14 is intermittently rotated, when the electric component is brought into abutting-contact with the ceramic board 22 as a result of the downward movement of the suction head 16, when the ceramic board 22 is moved and stopped by the XY table 44, or when the component feeder 32 is moved and stopped by the feeder supporting table 30. However, the vibration applied to the ceramic board 22 is damped or absorbed by the board supporting device 140 including the first and second supporting members 150, 152, whereby the ceramic board 22 is prevented from being vibrated, or vibration of the ceramic board 22 is rapidly settled or stopped even if the ceramic board 22 is somewhat vibrated. That is, the ceramic board 22 is not vibrated at least at a point of time at which the electric component is mounted onto the upper surface 147 of the ceramic board 22, whereby the electric component is mounted in a desired portion of the upper surface 147 with high accuracy.

Further, since each of the supporting members 150, 152 is formed of the elastic material, the ceramic board 22 can be brought into contact at the lower surface 144 with the supporting members 150, 152, without a large compressive stress being concentrated in a local portion of the upper end surface of each of the supporting members 150, 152, whereby the lower surface 144 of the ceramic board 22 is reliably positioned in a desired position, making it possible to accurately mount the electric component on the upper surface 147 of the ceramic board 22 without a risk of failure in mounting of the electric component onto the ceramic board 22. Moreover, the board supporting device 140 has the simple construction which is effective to minimize or eliminate the vibration of the ceramic board 22, and is capable of supporting of the ceramic board 22 without forcing the ceramic board 22 to be excessively deformed, namely, without providing a risk of fracture of the ceramic board 22 even if the ceramic board 22 is upwardly or downwardly convexed rather than flat. Where the ceramic board 22 is upwardly convexed, the ceramic board 22 is supported by only the contacts of the upper end surfaces 180 of the first supporting members 150. However, also in this case, the vibration of the ceramic board 22 is satisfactorily reduced. Still further, in the present embodiment in which the plurality of supporting members are arranged in the staggered pattern, the ceramic board 22 can be supported, at a plurality of portions of the lower surface 144 which are distributed evenly over the entirety of the lower surface 144 and which are distant from each other by a minimized distance, by some or all of the supporting members 150, 152, whereby the ceramic board 22 can be held parallel with respect to the holding plate 148.

In the present embodiment, the suction head 16 serves as a work head which is capable of achieving a predetermined work in a desired portion of the ceramic board 22. The board positioning and holding device 46 serves as a board holding device which is capable of holding the ceramic board 22. The ball screw 52, a nut engaged with the ball screw 52, the X-axis servomotor 54, the X table 58, the ball screw 60, a nut engaged with the ball screw 60, the Y-axis servomotor 62 and the Y table 66 cooperate with each other to constitute a horizontally linear movement device. This horizontally linear movement device cooperates with a first vertical movement device (which includes the first elevator table 70 and the air cylinder 86), the intermittently rotating device (which includes the index table 14 capable of intermittently rotating each suction head 16 as the work head) and a second vertical movement device (which is capable of upwardly and downwardly moving each suction head 16 as the work head), to constitute a relative movement which is capable of moving the board holding device and the working head relative to each other.

The first and second supporting members 150, 152 do not have to be necessarily arranged in the above-described staggered pattern, but may be otherwise arranged. The elastic material forming each first supporting member 150 and the elastic material forming each second supporting member 152 do not have to have the different degree of hardness, but may have the same degree of hardness. For example, simply by making the cross sectional area of each first supporting member 150 smaller than that of each second supporting member 152, each first supporting member 150 can be adapted to have lower compression modulus than each second supporting member 152. The diameter, height and hardness of each of the supporting members 150, 152 may be modified suitably depending upon various factors.

Each of the supporting members 150, 152 does not have to necessarily consist of the cylindrical member having the circular cross section, but may consist of a prism member having a rectangular, hexagonal, trapezoidal or other polygonal cross section. Further, each of the supporting members 150, 152 does not have to be necessarily formed of the vibration damping rubber, but may be formed of other material such as a foamed material.

While the supporting members 150, 152 are fixed to the holding plate 148 by fitting the supporting members 150, 152 into the receiving holes 186, 188 with application of a bonding agent between the supporting members 150, 152 and the receiving holes 186, 188 in the illustrated embodiment, it is also possible to fix the supporting members 150, 152 to the holding plate 148 by using a permanent magnet. For example, the permanent magnet may be embedded in an end surface of each of the supporting members 150, 152, while the holding plate 148 may be formed of a magnetic material such as iron. Further, while the bonding agent is used to fix the supporting members 150, 152 to the holding plate 148 in the illustrated embodiment, it is also possible to use other adhesive such as a tacky agent. Still further, the fixing means for fixing the supporting members 150, 152 to the holding plate 148 may be provided by a pair of fastening clothes or other repeatedly usable member, in place of the adhesive and permanent magnet.

While each of the supporting members 150, 152 is provided by a single piece which is formed entirely of the damping rubber in the above-illustrated embodiment, it is also possible to form each of the supporting members 150, 152 by assembling two members which are formed independently of each other. In this case, each of the supporting members 150, 152 can be constituted by an upper distal end portion of each of the supporting members 150, 152 which is to be brought into contact with the lower surface 144 of the ceramic board 22, and a lower proximal end portion which supports the upper distal end portion and which includes fixing means for fixing the supporting member to the holding plate 148, so that the upper distal end portion and the lower proximal end portion are provided by the assembled two members.

The fragile-board supporting method and the electric-circuit manufacturing method according to the present invention can be carried out not only in the above-described electric-component mounting system but also in other electric-component mounting system having, for example, a construction in which the printed circuit board is linearly movable in a first direction while the suction or mounting head is linearly movable in a second direction that is perpendicular to the first direction on a plane, or a construction in which the printed circuit board is fixed in a predetermined position while the suction or mounting head is movable to a desired position on a plane. Where the electric-component mounting device has a plurality of mounting heads, the mounting heads may be provided in a head moving device, so as to be movable with the head moving device on a plane. In this case, the mounting head may not be movable relative to the head moving device in any directions parallel to the plane. Alternatively, a mounting device, in which the plurality of suction or mounting heads are rotatable about the common axis so as to be sequentially positioned in each of the plurality of operation positions, may be adapted to be movable by the head moving device to a desired position on a plane.

Each of the component feeders 32 may be replaced with an appropriate one of various sorts of component feeders, such as a feeder which stores the electric components in a casing, then arranges the electric components in an array, so as to feed the arranged electric components to the component supplying portion, from which the electric components are supplied one by one. The feeding of the arranged electric components from the casing to the component supply device may be performed by vibrating the casing, utilizing the inclination of the casing, applying an air flow to the electric components stored in the casing, or circulating one or more conveyor belts for conveying the electric components, or combining two or more those manners.

While each of the component feeders 32 includes the component feeding device and the component storing device both provided on its common main frame in the above-illustrated embodiment, the component feeding device and the component storing device of each of the component feeders 32 may be provided separately from each other. In this case, the component storing device may not be movable, so that only the component feeding device is movable whereby the component supplying portions of the respective component feeding devices may be sequentially positioned in a component supplying position. Alternatively, the component storing devices may be moved to follow the component feeding devices being moved.

Figure 8:
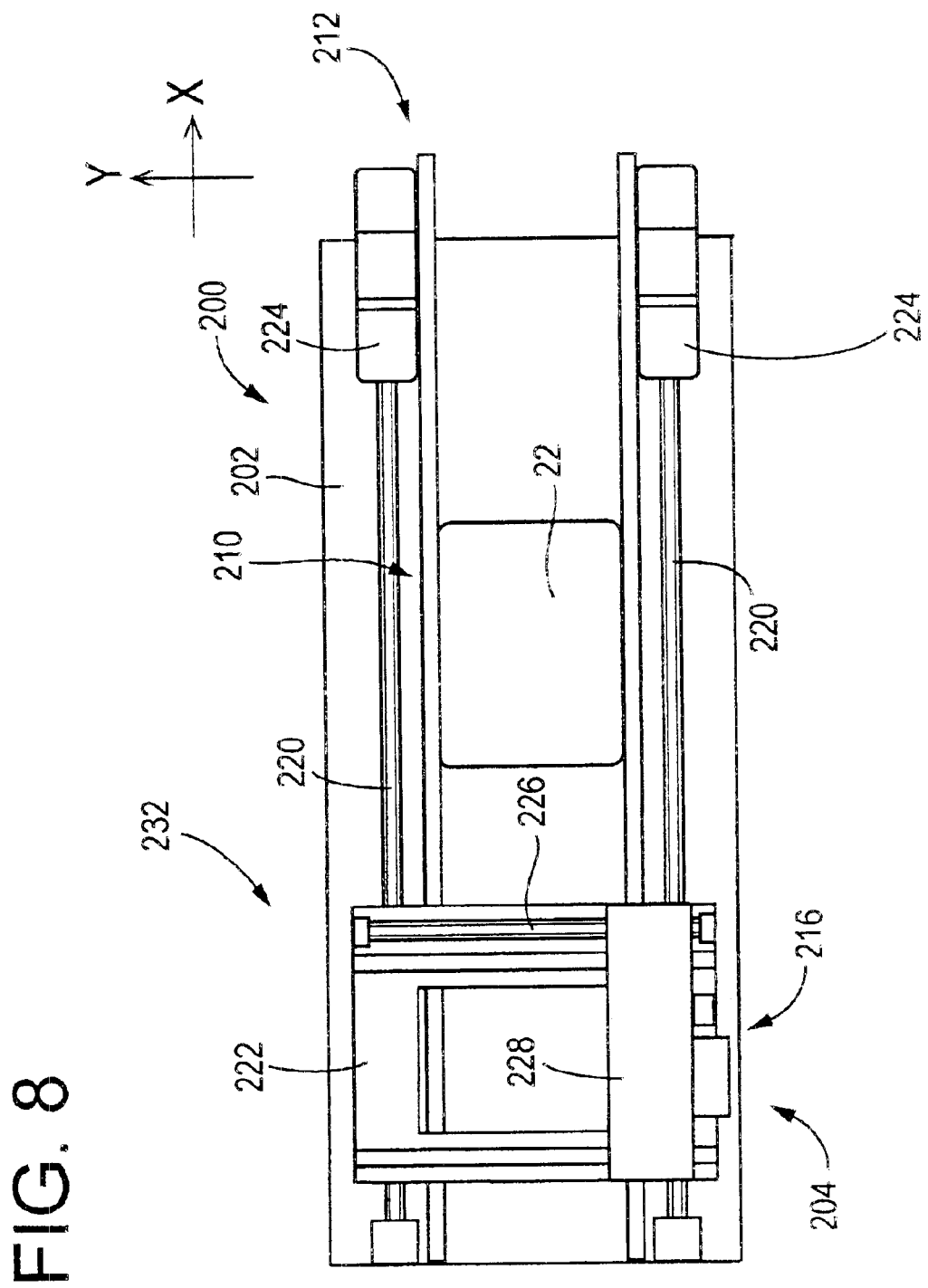
FIG. 8 is a schematic upper plan view of an adhesive applying system equipped with a circuit-board supporting device which is constructed according to another embodiment of the invention and which is capable of advantageously carrying out a fragile-board supporting method and an electric-circuit manufacturing method which are arranged according to the invention.

The circuit-board supporting device constructed according to the present invention can be employed in the board work system in the form of an adhesive applying system 200, as shown in FIG. 8, which is equipped with the working head in the form of an applying head 216 capable of applying an adhesive as a viscous fluid to the circuit board. The adhesive applying system 200 includes an adhesive applying device 204 and a board positioning and holding device 210 which are disposed on a base 202. The board positioning and holding device 210 is provided for positioning the ceramic board 22 in a predetermined position and holding the ceramic board 22 in the predetermined position. The board positioning and holding device 210 includes a board conveyor 212 which extends in an X-axis direction corresponding to the horizontal direction as seen in FIG. 8, and a board supporting device (not shown) which is disposed in an intermediate portion of the board conveyor 212 and which has substantially the same construction as the above-described board supporting device 140. The ceramic board 22 is conveyed by the board conveyor 212, so as to be positioned in the predetermined position. The ceramic board 22 is then clamped or held by a board holding mechanism (not shown) and supported by first and second supporting members having substantially the same construction as the above-described first and second supporting members 150, 152. While the ceramic board 22 is thus held in the predetermined position, the adhesive as a sort of applying agent is applied to a desired portion or portions of the ceramic board 22. It is noted that the board supporting device and the board holding mechanism cooperate with each other to constitute a board holding device in this embodiment.

The adhesive applying device 204 has the applying head 216 which is moved in the X-axis direction and/or Y-axis direction that is perpendicular to the X-axis direction, for applying the adhesive on the upper surface (i.e., work surface) of the ceramic board 22. The adhesive applying device 204 is equipped with a horizontal movement device 232 which includes a pair of feed screws 220, nuts engaged with the respective feed screws 220, an X table 222, a pair of X-axis drive motors 224, a feed screw 226, a nut engaged with the feed screw 226, a Y table 228 and a Y-axis drive motor (not shown). The applying head 216 is movable by the horizontal movement device 232 to a desired position on a plane that is parallel with the upper surface of the ceramic board 22. It is noted that the horizontal movement device 232 constitutes a part of a relative movement device capable of moving the board holding device and the adhesive applying device 204 relative to each other in this embodiment.

Also in the board holding device of the adhesive applying system 200 constructed according to this embodiment, the board can be reliably supported even if the board is upwardly or downwardly convexed, whereby the adhesive can be applied to the desired portion or portions of the board with high stability. The adhesive applying device 204 may be provided with a stopper with which the ceramic board 22 is to be brought into abutting contact, so that the ceramic board 22 is positioned in a predetermined position relative to the adhesive applying device 204, by the abutting contact if the ceramic board 22 with the stopper. Since the vibration of the ceramic board 22 is settled or stopped in the same manner as in the above-illustrated embodiment, the ceramic board 22 is brought into abutting contact with the stopper without the vibration of the ceramic board 22, so that the ceramic board 22 can be accurately positioned in the predetermined position relative to the adhesive applying device 204, whereby a desired amount of the adhesive can be reliably applied onto the ceramic board 22 in a desired pattern. It should be noted that the provision of the stopper in the adhesive applying device 204 is not essential. That is, as long as the vibration of the ceramic board 22 is settled or stopped by the board holding device, the position of the ceramic board 22 relative to the adhesive applying device 204 is held constant, whereby the desired amount of the adhesive can be applied onto the ceramic board 22 in the desired pattern.

While the presently preferred embodiments of this invention have been described above in detail by reference to the accompanying drawings, fro illustrative purpose only, it is to be further understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. A board supporting device comprising:
    a plurality of first supporting members formed of an elastic material;
    a plurality of second supporting members formed of an elastic material and having higher compression modulus than said first supporting members; and
    a supporting-members holding member which holds said first and second supporting members,
    wherein said supporting members are arranged on said supporting-members holding member such that each of said first supporting members is adjacent to a corresponding one of said second supporting members,
    and wherein said supporting members project from said supporting-members holding member such that a distal end of each of said first supporting members lies on a plane while a distal end of each of said second supporting members lies on one of opposite sides of said plane which is closer to said supporting-members holding member.

2. A board supporting device according to claim 1, wherein said supporting-members holding member includes a substantially flat plate.

3. A board supporting device according to claim 2, wherein said flat plate has a plurality of receiving holes formed therein, and wherein each of said supporting members is received at a proximal end portion thereof in a corresponding one of said receiving holes.

4. A board supporting device according to claim 3, wherein said proximal end portion of each of said first supporting members has a thickness which is equal to that of said proximal end portion of each of said second supporting members and each of said first supporting members has a distal end portion whose thickness is small than that of a distal end portion of each of said second supporting members.

5. A board supporting device according to claim 3, wherein said receiving holes includes first holes and second holes each of which has an inner dimension larger than that of each of said first holes,
    wherein each of said first supporting members has a thickness which is constant as viewed in a projection direction in which each of said supporting members projects from said flat plate, while each of said second supporting members has a thickness which is constant as viewed in said projection direction and which is larger than said thickness of each of said first supporting members,
    and wherein said first supporting members are received in said first holes while said second supporting members are received in said second holes.

6. A board supporting device according to claim 1, wherein each of the elastic materials forming said first and second supporting members has a loss tangent (tan δ) not smaller than 0.5, as measured when the elastic material is subjected to vibration of 110 Hz at a temperature of 20° C.

7. A board supporting device according to claim 1, further including:
    a board holding mechanism which holds opposite end portions of a board such that said opposite end portions of said board have the same distance from said plate, and wherein said first and second supporting members are positioned relative to said board holding mechanism such that said board can be supported at one of opposite surfaces thereof by said supporting members while being held at said opposite end portions by said board holding mechanism.

8. A board supporting device according to claim 1, supporting a circuit board as said board which is to be subjected to a predetermined work achieved by a working head whose position relative to said circuit board is changeable by a relative movement device.

9. A board supporting device according to claim 1, supporting a circuit board as said board onto which an electric component is to be mounted by a mounting head whose position relative to said circuit board is changeable by a relative movement device.

10. A board supporting device comprising:
    a plurality of first supporting members formed of an elastic material;
    a plurality of second supporting members formed of an elastic material and having higher compression modulus than said first supporting material; and
    a supporting members holding member for holding said first and second supporting members,
    wherein said second supporting members have lengths smaller than those of said first supporting members, so that distal ends of said second supporting members are closer than distal ends of said first supporting members to said supporting members holding member, when said first and second supporting members are held by said supporting members holding member.

11. A board supporting device according to claim 10, wherein said supporting members holding member includes a substantially flat plate.

12. A board supporting device according to claim 11, wherein said flat plate has a plurality of receiving holes formed therein, so that each of said supporting members can be received at a proximal end portion thereof in a corresponding one of said receiving holes.

13. A board supporting device according to claim 12, wherein
    said proximal end portion of each of said first supporting members has a thickness which is equal to that of said proximal end portion of each of said second supporting members, and each of said first supporting members has a distal end portion whose thickness is smaller than that of a distal end portion of each of said second supporting members.

14. A board supporting device according to claim 12, wherein said receiving holes includes first holes and second holes each of which has an inner dimension larger than that of each of said first holes, each of said first supporting members has a thickness which is constant as viewed in a projection direction in which each of said supporting members projects from said flat plate, while each of said second supporting members has a thickness which is constant as viewed in said projection direction and which is larger than said thickness of each of said first supporting members, so that said first supporting members can be received in said first holes while said second supporting members can be received in said second holes.

15. A board supporting device according to claim 10, wherein each of the elastic materials forming said first and second supporting members has a loss tangent (tan δ) not smaller than 0.5, as measured when the elastic material is subjected to vibration of 110 Hz at a temperature of 20° C.

16. A board supporting device according to claim 10, further including:

a board holding mechanism which holds opposite end portions of a board such that said opposite end portions of said board have the same distance from said supporting members holding member, wherein said first and second supporting members are positioned relative to said board holding mechanism such that said board can be supported at one of opposite surfaces thereof by said supporting members while being held at said opposite end portions by said board holding mechanism.

17. A board supporting device according to claim 10, supporting a circuit board as said board which is to be subjected to a predetermined work achieved by a working head whose position relative to said circuit board is changeable by a relative movement device.

18. A board supporting device according to claim 10, supporting a circuit board as said board onto which an electric component is to be mounted by a mounting head whose position relative to said circuit board is changeable by a relative movement device.

* * * * *